United States Patent
Li et al.

(10) Patent No.: US 11,968,879 B2
(45) Date of Patent: Apr. 23, 2024

(54) DISPLAY SUBSTRATE, MANUFACTURING METHOD THEREOF, AND DISPLAY APPARATUS

(71) Applicant: BOE Technology Group Co., Ltd., Beijing (CN)

(72) Inventors: Yunlong Li, Beijing (CN); Pengcheng Lu, Beijing (CN); Yu Ao, Beijing (CN); Zhijian Zhu, Beijing (CN); Yuanlan Tian, Beijing (CN); Dacheng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 641 days.

(21) Appl. No.: 17/260,562

(22) PCT Filed: Mar. 27, 2020

(86) PCT No.: PCT/CN2020/081856
§ 371 (c)(1),
(2) Date: Jan. 15, 2021

(87) PCT Pub. No.: WO2021/189484
PCT Pub. Date: Sep. 30, 2021

(65) Prior Publication Data
US 2022/0140021 A1    May 5, 2022

(51) Int. Cl.
*H10K 59/88*     (2023.01)
*H01L 23/544*    (2006.01)
(Continued)

(52) U.S. Cl.
CPC .......... *H10K 59/88* (2023.02); *H01L 23/544* (2013.01); *H10K 50/856* (2023.02);
(Continued)

(58) Field of Classification Search
CPC ...... H10K 59/88; H10K 59/131; H10K 59/38; H10K 59/1315; H10K 59/10;
(Continued)

(56) References Cited

U.S. PATENT DOCUMENTS

2004/0046905 A1  3/2004  Hong et al.
2010/0157411 A1  6/2010  Kwon et al.
(Continued)

FOREIGN PATENT DOCUMENTS

CN    1290922 A      4/2001
CN    101794050 A    8/2010
(Continued)

OTHER PUBLICATIONS

Office Action dated Sep. 19, 2022 for Chinese Patent Application No. 202080000418.6 and English Translation.

*Primary Examiner* — Farun Lu
*Assistant Examiner* — Sandra Milena Rodriguez Villanu
(74) *Attorney, Agent, or Firm* — Ling Wu; Stephen Yang; Ling and Yang Intellectual Property

(57) ABSTRACT

A display substrate, a manufacturing method thereof and a display apparatus are disclosed. The display substrate includes a silicon base substrate and a color film layer disposed on the silicon base substrate. A plurality of metal traces for connecting a display area and a cathode ring with a bonding area respectively are contained in the silicon base substrate. The color film layer includes a first align mark, and the first align mark has a hollowed-out structure. A projection of the first align mark on the silicon base substrate and projections of the metal traces on the silicon base substrate include overlapping areas.

11 Claims, 13 Drawing Sheets

(51) Int. Cl.
*H10K 50/856* (2023.01)
*H10K 59/131* (2023.01)
*H10K 59/38* (2023.01)
*H10K 71/00* (2023.01)
*H10K 77/10* (2023.01)

(52) U.S. Cl.
CPC ........... *H10K 59/131* (2023.02); *H10K 59/38* (2023.02); *H10K 71/00* (2023.02); *H10K 77/10* (2023.02); *H01L 2223/54426* (2013.01); *H10K 71/851* (2023.02)

(58) Field of Classification Search
CPC ...... H10K 50/856; H10K 50/19; H10K 50/80; H10K 71/00; H10K 71/851; H10K 77/10; H01L 23/544; H01L 2223/54426; H01L 2223/54486
See application file for complete search history.

(56) References Cited

U.S. PATENT DOCUMENTS

| | | | |
|---|---|---|---|
| 2013/0161628 A1 | 6/2013 | Suzuki et al. | |
| 2015/0362770 A1 | 12/2015 | Yang et al. | |
| 2017/0192266 A1* | 7/2017 | Li | G02F 1/1337 |
| 2017/0192320 A1* | 7/2017 | Wang | G02F 1/136209 |
| 2019/0325246 A1* | 10/2019 | Baidya | G06V 10/25 |
| 2019/0348624 A1* | 11/2019 | Kim | H10K 59/122 |
| 2020/0106041 A1* | 4/2020 | Lee | H10K 50/19 |
| 2020/0203654 A1* | 6/2020 | Moon | H10K 59/10 |
| 2021/0055595 A1* | 2/2021 | Park | G02F 1/133514 |
| 2022/0190098 A1* | 6/2022 | Lim | H10K 59/40 |

FOREIGN PATENT DOCUMENTS

| | | |
|---|---|---|
| CN | 102812541 A | 12/2012 |
| CN | 105446039 A | 3/2016 |
| CN | 110703479 A | 1/2020 |
| CN | 110807988 A | 2/2020 |
| JP | 2004-347659 A | 12/2004 |

* cited by examiner

DISPLAY SUBSTRATE, MANUFACTURING METHOD THEREOF, AND DISPLAY APPARATUS

CROSS-REFERENCE TO RELATED APPLICATION

The present application is a U.S. National Phase Entry of International Application No. PCT/CN2020/081856 having an international filing date of Mar. 27, 2020, which is incorporated into this application by reference in its entirety.

TECHNICAL FIELD

The present disclosure relates to, but is not limited to, the field of display technology, and particularly relates to a display substrate, a manufacturing method thereof, and a display apparatus.

BACKGROUND

Micro Organic Light-Emitting Diode (Micro-OLED) is a micro-display developed in recent years, and a silicon OLED is one of them. The silicon OLED can realize not only the active addressing of pixels, but also the preparation of a timing control (TCON) circuit, an over-current protection (OCP) circuit or other functional circuits on a silicon base substrate, which is beneficial to the reduction of system volume, thus realizing light weight. The silicon OLED is fabricated by the mature complementary metal oxide semiconductor (CMOS) integrated circuit technology, which has the advantages of small volume, high resolution (PPI) and high refresh rate, and is widely used in the near-eye display field of Virtual Reality (VR) or Augmented Reality (AR).

In the manufacturing process of a silicon OLED micro-display panel, in order to enable a bonding platform to bond accurately and stably, it is needed to provide a first align mark at the corresponding position of the substrate for the bonding platform to align. Since the first align mark is generally made of an anode layer metal or a reflective layer metal, it is needed to keep a certain distance between the first align mark and other metal traces, and also, it is easy to form Metal-Insulator-Metal (MIM) capacitance effect between the first align mark and other metal traces, resulting in electrical breakdown or other defects. In addition, according to the requirements of the bonding platform, the distance between the first align mark and the upper border of the bonding pad needs to be greater than or equal to a preset minimum distance. That is, the border area of the substrate increases due to the first align mark, which affects the cutting efficiency of the whole motherboard.

SUMMARY

The following is a summary of the subject matters described in detail herein. This summary is not intended to limit the protection scope of the claims.

An embodiment of the present disclosure provides a display substrate, which includes a silicon base substrate and a color film layer disposed on the silicon base substrate. A plurality of metal traces for connecting a display area and a cathode ring with a bonding area respectively are contained in the silicon base substrate. The color film layer includes a first align mark, the first align mark has a hollowed-out structure. A projection of the first align mark on the silicon base substrate and projections of the metal traces on the silicon base substrate include overlapping areas.

In some possible implementations, the color film layer in the display area includes a first color unit, a second color unit and a third color unit arranged in an array; the color film layer outside the display area includes at least one of the first color unit, the second color unit and the third color unit forming a complete surface.

In some possible implementations, the color film layer outside the display area includes a first color unit layer and a second color unit layer which are sequentially stacked, and the first color unit layer and the second color unit layer include mutually penetrating apertures to form the first align mark through the apertures.

In some possible implementations, the first color unit layer is a blue color filter unit layer and the second color unit layer is a red color filter unit layer.

In some possible implementations, the length of the first align mark is 50 to 150 microns, the width of the first align mark is 20 to 50 microns; the width of the metal trace is 50 to 150 nanometers, and the spacing between adjacent metal traces is 30 to 50 nanometers.

In some possible implementations, a ratio of the area of the metal traces exposed by the first align mark to the area of the first align mark is greater than or equal to 80%.

In some possible implementations, the display area includes a light-emitting structural layer disposed on the silicon base substrate, and the light-emitting structural layer includes a reflective layer, an anode layer, an organic light-emitting layer and a cathode layer which are sequentially stacked. A driving circuit layer is disposed in the silicon base substrate of the display area and includes a first scanning line, a first power line, a data line, a switching transistor and a driving transistor. A control electrode of the switching transistor is connected with the first scanning line, a first electrode of the switching transistor is connected with the data line, and a second electrode of the switching transistor is connected with a control electrode of the driving transistor. A first electrode of the driving transistor is connected with the first power line. The switching transistor is configured to receive a data signal transmitted by the data line under the control of a first scanning signal output by the first scanning line, so that the control electrode of the driving transistor receives the data signal. The driving transistor is configured to generate a corresponding current at the second electrode under the control of the data signal received by the control electrode thereof. The metal traces and the driving circuit layer are disposed on the same layer.

In some possible implementations, the cathode ring includes a power supply electrode layer disposed on the silicon base substrate, a reflective layer disposed on a side of the power supply electrode layer away from the silicon base substrate, an anode layer disposed on a side of the reflective layer away from the power supply electrode layer, and a cathode layer disposed on a side of the anode layer away from the reflective layer.

In some possible implementations, the bonding area includes a bonding electrode layer disposed on the silicon base substrate and an insulating layer covering the bonding electrode layer, and a via exposing a bonding electrode in the bonding electrode layer is disposed in the insulating layer.

In some possible implementations, the bonding area further includes a second align mark layer disposed on the silicon base substrate, and the second align mark layer and the bonding electrode layer are disposed on the same layer.

An embodiment of the present disclosure also provides a display apparatus including the display substrate of any one of the above embodiments.

An embodiment of the present disclosure also provides a manufacturing method of a display substrate, including: providing a display substrate motherboard, wherein the display substrate motherboard includes at least one display substrate area, the display substrate area includes a silicon base substrate, and a plurality of metal traces for connecting a display area and a cathode ring with a bonding area respectively are contained in the silicon base substrate; forming a color film layer on the silicon base substrate, wherein the color film layer includes a first align mark, and the first align mark has a hollowed-out structure; a projection of the first align mark on the silicon base substrate and projections of the metal traces on the silicon base substrate include overlapping areas; and cutting the display substrate motherboard to obtain a separate display substrate.

In some possible implementations, the color film layer in the display area includes a first color unit, a second color unit and a third color unit arranged in an array; the color film layer outside the display area includes at least one of the first color unit, the second color unit and the third color unit forming a complete surface.

Other aspects will become apparent upon reading and understanding the brief description of the drawings and embodiments of the present disclosure.

Figure 1:
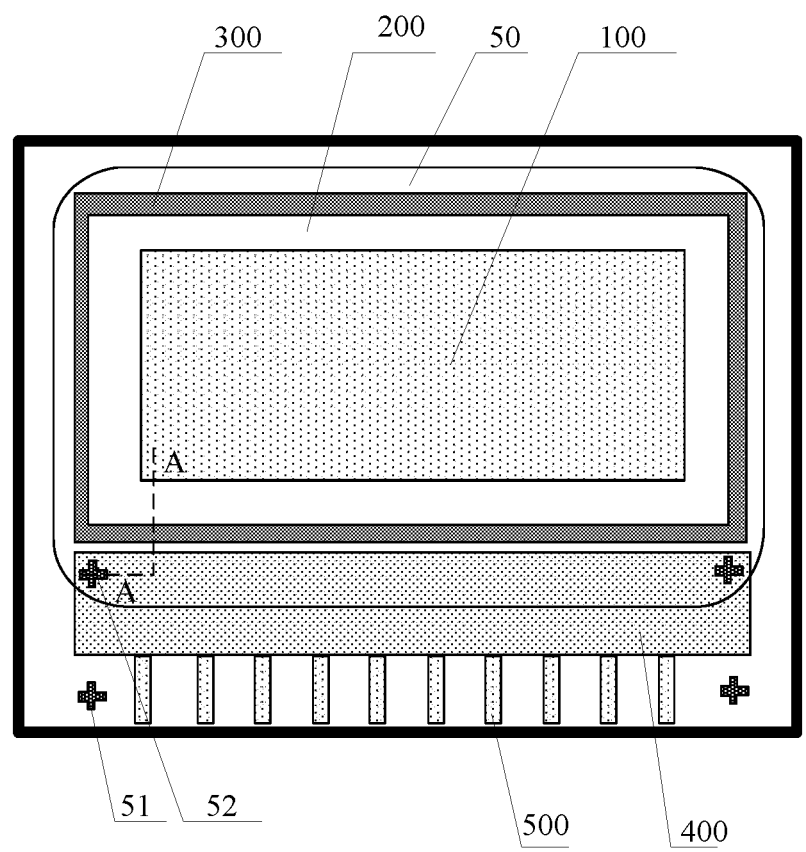
FIG. 1 is a schematic structural diagram of a display substrate according to an embodiment of the present disclosure.

| Description of the Reference Signs: | | |
|---|---|---|
| 10-Silicon base substrate; | 11-Driving thin film transistor; | 12-First insulating layer; |
| 13-First conductive pillar; | 14-Reflective electrode; | 15-Second insulating layer; |
| 16-Second conductive pillar; | 20-Light-emitting structural layer; | 31-Anode; |
| 32-Pixel defining layer; | 33-Organic light-emitting layer; | 34-Cathode; |
| 40-Encapsulation layer, | 50-Color film layer; | 51-Second align mark; |
| 52-First align mark; | 53-First color unit; | 54-Second color unit; |
| 55-Third color unit; | 60-Protective layer; | 70-Cover plate; |
| 100-Display area; | 101-Pixel driving circuit; | 102-Light-emitting device; |
| 110-Voltage control circuit; | 200-Dummy pixel area; | 300-Cathode ring; |
| 301-Power supply electrode; | 400-Metal trace area; | 401-Metal trace; |
| 500-Bonding area; | 501-Bonding electrode; | 502-Bonding via; |
| 331-First light-emitting sublayer; | 332-First charge generating layer; | 333-Second light-emitting sublayer; |
| 334-Second charge generating layer; | 335-Third light-emitting sublayer; | 3311-First hole transport layer; |
| 3312-First emitting material layer; | 3313-First electron transport layer; | 3331-Second hole transport layer; |
| 3332-Second emitting material layer; | 3333-Second electron transport layer; | 3351-Third hole transport layer; |
| 3352-Third emitting material layer; | 3353-Third electron transport layer. | |

DETAILED DESCRIPTION

To make the objects, technical solutions and advantages of the present disclosure more clear, embodiments of the present disclosure will be described in detail below with reference to the accompanying drawings. The implementations may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following implementations. If there is no conflict, embodiments in the present disclosure and features in the embodiments may be combined with each other arbitrarily.

In the drawings, the sizes of various constituent elements, or the thickness or area of a layer, are sometimes exaggerated for clarity. Therefore, implementations of the present disclosure are not necessarily limited to the sizes shown, and the shapes and sizes of various components in the drawings do not reflect true proportions. In addition, the drawings schematically show ideal examples, and implementations of the present disclosure are not limited to the shapes or values shown in the drawings.

The "first", "second", "third" and other ordinal numbers in this specification are used to avoid confusion of constituent elements, but not to limit in quantity.

In this specification, for convenience, words indicating orientation or position relationship, such as "middle", "upper", "lower", "front", "rear", "vertical", "horizontal", "top", "bottom", "inside" and "outside" or the like, are used to indicate the position relationship of constituent elements with reference to the drawings, which are only for ease of description of the present specification and simplification of the description, rather than indicating or implying that the referred apparatus or element must have a specific orientation, or be constructed and operated in a particular orientation, and therefore cannot be understood as a limitation on the present disclosure. The position relationship of the constituent elements is appropriately changed according to the directions of various constituent elements described. Therefore, it is not limited to the words described in this specification, and can be replaced as appropriate according to specific situations.

In this specification, the terms "install", "connect" and "couple" shall be broadly understood unless otherwise explicitly specified and defined. For example, it may be a fixed connection, or a removable connection, or an integral connection; it may be mechanically connected, or electrically connected. It may be a direct connection, or an indirect connection through an intermediate element, or an internal connection between two elements. For those of ordinary skill in the art, the specific meanings of the above terms in the present disclosure may be understood according to specific situations.

In this specification, a transistor refers to an element including at least three terminals, namely a gate electrode, a drain electrode and a source electrode. A transistor has a channel area between a drain electrode (drain electrode terminal, drain area or drain electrode) and a source electrode (source electrode terminal, source area or source electrode), and current can flow through the drain electrode, the channel area and the source electrode. In this specification, the channel area refers to an area through which current mainly flows.

In this specification, it may be the first electrode as drain electrode and the second electrode as source electrode, or it may be the first electrode as source electrode and the second electrode as drain electrode. The functions of the "source electrode" and the "drain electrode" are sometimes interchanged under the circumstance that transistors with opposite polarities are used or the circumstance that the current direction changes during circuit operation, or other circumstances. Therefore, in this specification, "source electrode" and "drain electrode" can be interchanged.

In this specification, "connection" includes a circumstance where the constituent elements are connected together through an element having a certain electrical action. The "element having a certain electrical action" is not particularly limited as long as it can transmit and receive an electrical signal between the connected constituent elements. Examples of the "element having a certain electrical action" include not only electrodes and wirings, but also switching elements such as transistors, resistors, inductors, capacitors, and other elements with various functions.

In this specification, "parallel" refers to a state in which two straight lines form an angle of −10 degrees or more and 10 degrees or less, and thus also includes a state in which the angle is −5 degrees or more and 5 degrees or less. In addition, "perpendicular" refers to a state in which two straight lines form an angle of 80 degrees or more and 100 degrees or less, and thus also includes a state of an angle being 85 degrees or more and 95 degrees or less.

In this specification, "film" and "layer" can be interchanged. For example, sometimes "conductive layer" can be replaced by "conductive film". Similarly, "insulating film" can sometimes be replaced by "insulating layer".

In the manufacturing process of a silicon OLED microdisplay panel, in order to enable the bonding platform to bond accurately and stably, it is needed to provide a first align mark at the corresponding position of the substrate for the bonding platform to align. The align marks include a first align mark on the metal traces and a second align mark on a side of the metal traces, and the first align mark is generally made of an anode layer metal or a reflective layer metal. Because the first align mark is located on the metal traces in the display area and the cathode ring, it is very easy for the first align mark and the metal traces located below to form MIM capacitance effect, causing electrical breakdown or other defects. In addition, according to the requirements of the bonding platform, the minimum distance between the first align mark and the upper border of the bonding pad is 0.3 mm, and the minimum distance between the second align mark and the lower cutting border of the substrate is 0.48 mm. It is also needed to keep a certain distance between the first and second align marks and other metal traces. Therefore, the manufacturing method of the first align mark will increase the border area of the substrate and affect the cutting efficiency of the whole motherboard.

At least one embodiment of the present disclosure provides a display substrate, which includes a silicon base substrate and a color film layer disposed on the silicon base substrate. A plurality of metal traces for connecting a display area and a cathode ring with a bonding area respectively are contained in the silicon base substrate. The color film layer includes a first align mark, and the first align mark has a hollowed-out structure. A projection of the first align mark on the silicon base substrate and projections of the metal traces on the silicon base substrate include overlapping areas.

Some embodiments of the present disclosure also provide a display apparatus including the display substrate described above and a manufacturing method of the display substrate.

According to the display substrate provided by the above embodiment of the present disclosure, the first align mark is disposed on the color film layer, and the first align mark has a hollowed-out structure; the metal trace area can reflect light at the hollowed-out first align mark, and not reflect light at other positions due to the covering of the color film layer. That is, obvious gray level change is generated at the border of the first align mark, so that the border position of the first align mark can be accurately identified. The first align mark is manufactured by this method, which reduces the risk of capacitance breakdown, reduces the border area of the substrate and improves the cutting efficiency of the substrate, and the preparation process is simple and reliable.

FIG. 1 is a schematic structural diagram of a display substrate according to the present disclosure. As shown in FIG. 1, the display substrate includes a silicon base substrate 10 and a color film layer 50 disposed on the silicon base substrate 10. A plurality of metal traces for connecting a display area 100 and a cathode ring 300 with a bonding area 500 respectively are contained in the silicon base substrate 10. The color film layer 50 includes a first align mark 52, and the first align mark 52 has a hollowed-out structure. A projection of the first align mark 52 on the silicon base substrate 10 and projections of the metal traces on the silicon base substrate 10 include overlapping areas.

Figure 2:
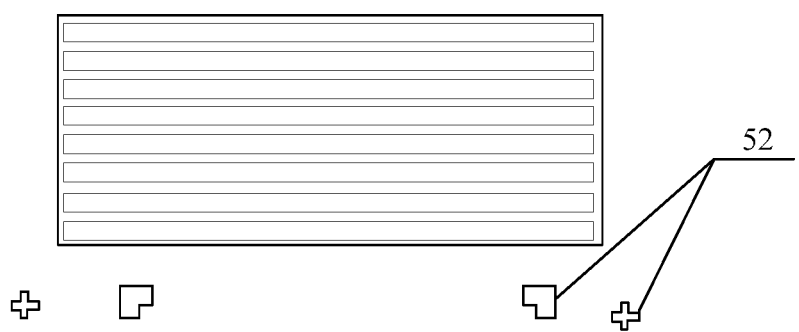
FIG. 2 is a schematic structural diagram of a color film layer according to an embodiment of the present disclosure.

In an exemplary embodiment, as shown in FIG. 2, the color film layer 50 in the display area 100 includes a first color unit, a second color unit and a third color unit arranged in an array. The first color unit, the second color unit and the third color unit can be one of a red color filter (CF) unit, a green color filter unit and a blue color filter unit, respectively. In some possible implementations, the first color unit, the second color unit and the third color unit in the display area 100 are arranged alternately in an array in a first extending direction (for example, in the row direction of FIG. 2); and the first color unit, the second color unit and the third color unit overlap with each other, and the overlapping position serves as a black matrix. In some possible implementations, the first color unit, the second color unit and the third color unit in the display area 100 may be manufactured by patterning column by column or by patterning pixel unit by pixel unit in a second extending direction (for example, in the column direction of FIG. 2). This is not limited in the present application.

In an exemplary embodiment, the color film layer outside the display area 100 includes at least one of a first color unit, a second color unit, and a third color unit forming a complete surface.

Figure 3:
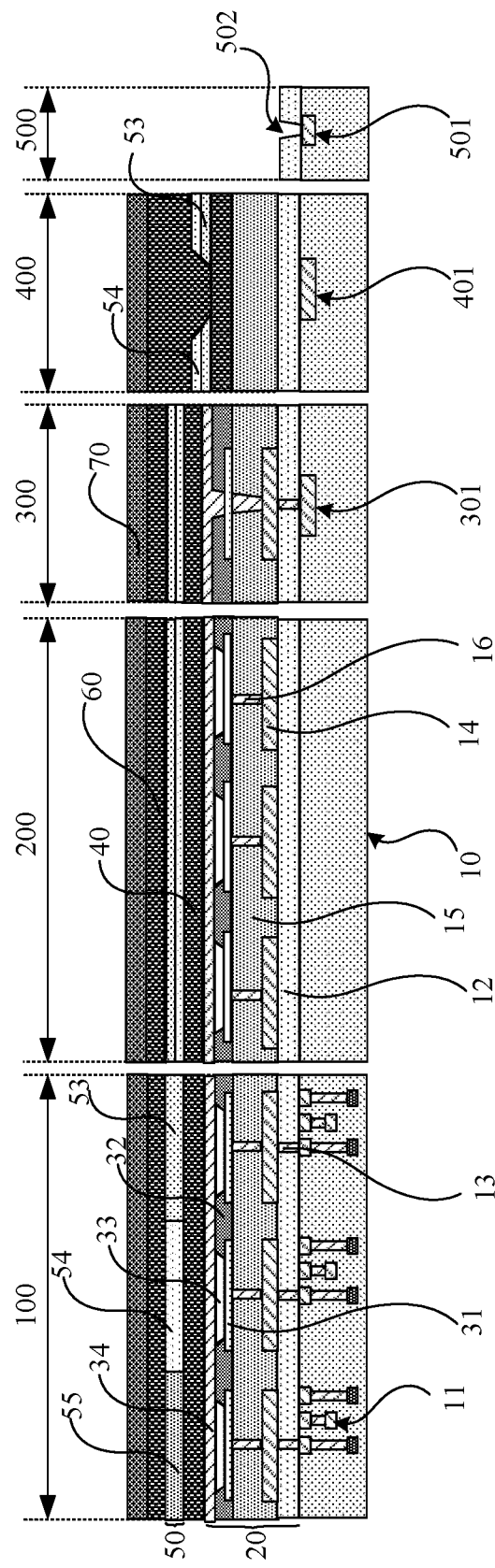
FIG. 3 is a schematic cross-sectional diagram of the display substrate shown in FIG. 1.

In this exemplary embodiment, the color film layer outside the display area 100 is the color film layer in the peripheral area. The display substrate includes the display area 100 and a peripheral area surrounding the display area 100. As shown in FIGS. 1 and 3, the peripheral area may include a dummy pixel area 200, a cathode ring 300, a metal trace area 400 and a bonding area 500.

In an exemplary embodiment, as shown in FIGS. 1 and 3, the color film layer 50 covers the display area 100, the dummy pixel area 200, the cathode ring 300 and part of the metal trace area 400.

In an exemplary embodiment, the color film layer outside the display area 100 includes a first color unit layer and a second color unit layer which are sequentially stacked. The first color unit layer and the second color unit layer include mutually penetrating apertures to form the first align mark 52 through the apertures.

In an exemplary embodiment, the first color unit layer may be a blue color filter unit layer and the second color unit layer may be a red color filter unit layer. The adhesion of the blue color filter unit is relatively high, and forming the blue color filter unit first can reduce the possibility of peeling off the color film layer 50 from the cathode. Because the red color filter unit has low adhesion and good fluidity, the number of bubbles on the surface of the blue color filter unit and the red color filter unit away from the cathode can be reduced in the process of forming the red color filter unit, so that the uniformity of film thickness of both the blue color filter unit and the red color filter unit can be improved.

In an exemplary embodiment, the length of the first align mark 52 may be 50 to 150 microns, the width of the first align mark 52 may be 20 to 50 microns; the width of the metal trace may be 50 to 150 nanometers, and the spacing between adjacent metal traces may be 30 to 50 nanometers. For example, as shown in FIG. 1, the first align mark 52 have a cross-shaped structure consisting of a transverse opening and a vertical opening. The transverse opening and the vertical opening are both 100 microns in length and 30 microns in width. The width of a metal trace is 100 nanometers, and the spacing between adjacent metal traces is 50 nanometers. The plurality of metal traces are integrated together through an integrated circuit. Due to the dense arrangement of the plurality of metal traces, reflection of light can occur at the hollowed-out first align mark 52 of the color film layer 50.

In an exemplary embodiment, a ratio of the area of the metal traces exposed by the first align mark 52 to the area of the first align mark 52 is greater than or equal to 80%.

In an exemplary embodiment, the display area 100 includes a light-emitting structural layer 20 disposed on the silicon base substrate 10. The light-emitting structural layer 20 includes a reflective layer, an anode layer, an organic light-emitting layer and a cathode layer which are sequentially stacked. In an exemplary implementation, the light-emitting structural layer 20 may also include a structural film layer, such as a pixel defining layer or a flat layer.

In an exemplary embodiment, the organic light-emitting layer 33 may directly emit white light through a white light material.

Figure 4:
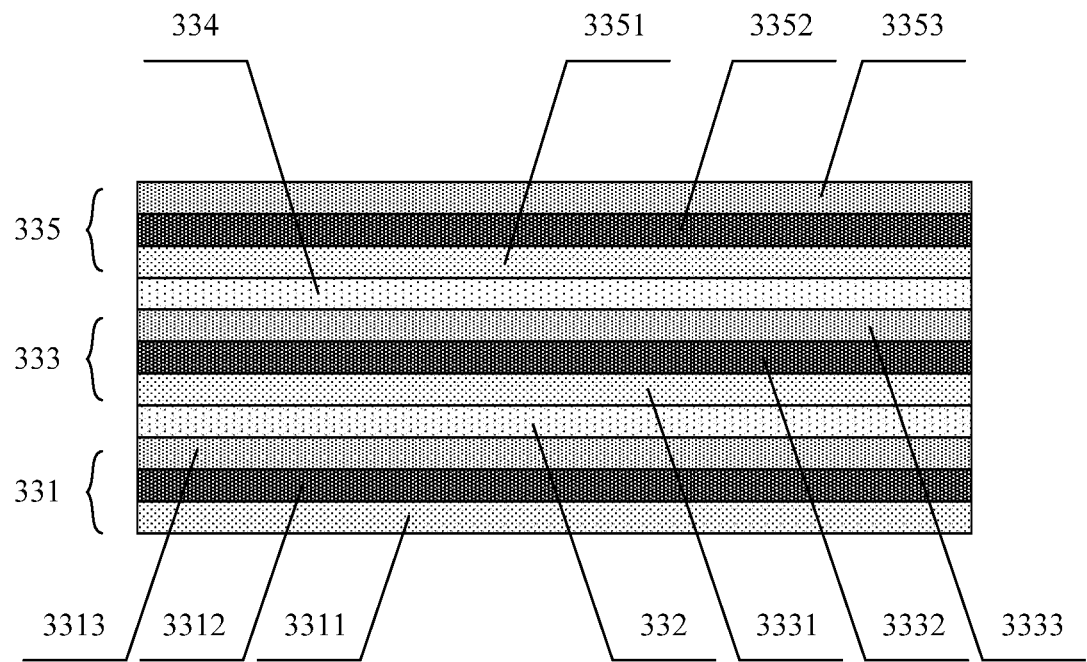
FIG. 4 is a schematic structural diagram of an organic light-emitting layer according to an embodiment of the present disclosure.

In another exemplary embodiment, the organic light-emitting layer 33 may emit white light by superimposing three materials of RGB. FIG. 4 is a schematic structural diagram of the organic light-emitting layer according to this embodiment. As shown in FIG. 4, the structure of the organic light-emitting layer in this embodiment includes a first light-emitting sublayer 331, a first charge generating layer 332, a second light-emitting sublayer 333, a second charge generating layer 334 and a third light-emitting sublayer 335 which are sequentially stacked between an anode and a cathode. The first light-emitting sublayer 331 is configured to emit a first color light, and includes a first hole transport layer (HTL) 3311, a first emitting material layer (EML) 3312, and a first electron transport layer (ETL) 3313 which are sequentially stacked. The second light-emitting sublayer 333 is configured to emit a second color light, and includes a second hole transport layer 3331, a second emitting material layer 3332 and a second electron transport layer 3333 which are sequentially stacked. The third light-emitting sublayer 335 is configured to emit a third color light, and includes a third hole transport layer 3351, a third emitting material layer 3352 and a third electron transport layer 3353 which are sequentially stacked. The first charge generating layer 332 is disposed between the first light-emitting sublayer 331 and the second light-emitting sublayer 333, and is used to connect the two light-emitting sublayers in series to realize transfer of carriers. The second charge generating layer 334 is disposed between the second light-emitting sublayer 333 and the third light-emitting sublayer 335, and is used to connect the two light-emitting sublayers in series to realize transfer of carriers. Since the organic light-emitting layer of the present disclosure includes a first emitting material layer emitting a first color light, a second emitting material layer emitting a second color light, and a third emitting material layer emitting a third color light, the light eventually emitted by the organic light-emitting layer is mixed light. For example, the first emitting material layer may be configured to a red light material layer emitting red light, the second emitting material layer may be configured to a green light material layer emitting green light, and the third emitting material layer may be configured to a blue light material layer emitting blue light. Therefore, the organic light-emitting layer eventually emits white light.

In an exemplary implementation, at least one layer of the organic light-emitting layer 33 may be disposed integrally or separately according to each pixel area, as long as the various colors of light-emitting layers in each pixel area can be stacked to emit white light.

In an exemplary implementation, the organic light-emitting layer 33 may be a light-emitting layer of red, green and blue colors arranged in an array respectively, and each pixel area emits red light, blue light or green light separately.

In an exemplary implementation, the organic light-emitting layer shown in FIG. 4 is only an exemplary structure, which is not limited by the present disclosure. In practical implementation, the structure of the organic light-emitting layer can be designed according to actual needs. For example, in each light-emitting sublayer, in order to improve the efficiency of injecting electrons and holes into the emitting material layer, a hole injection layer (HIL) and an electron injection layer (EIL) may be further disposed. In another example, in order to simplify the structure of the organic light-emitting layer, the first electron transport layer 3313, the first charge generating layer 332, and the second hole transport layer 3331 may be omitted, that is, the second emitting material layer 3332 may be disposed directly on the first emitting material layer 3312.

In some possible implementations, the organic light-emitting layer can emit white light as a whole through an organic light-emitting layer emitting a first color light and an organic light-emitting layer emitting a light complementary to the first color light, and the two organic light-emitting layers are sequentially stacked relative to the silicon base substrate, which is not limited by the present disclosure, as long as emission of white light can be realized. The present disclosure can achieve a high resolution of more than 2000 by adopting a white light plus color film mode, and the requirements of VR/AR can be met.

In an exemplary embodiment, a driving circuit layer is disposed in the silicon base substrate 10 in the display area 100 and includes a first scanning line, a first power line, a data line, a switching transistor and a driving transistor. A control electrode of the switching transistor is connected with the first scanning line, a first electrode of the switching transistor is connected with the data line, a second electrode of the switching transistor is connected with a control electrode of the driving transistor, and a first electrode of the driving transistor is connected with the first power line. The switching transistor is configured to receive a data signal transmitted by the data line under the control of a first scanning signal output by the first scanning line, so that the control electrode of the driving transistor receives the data signal. The driving transistor is configured to generate a corresponding current at a second electrode under the control of the data signal received by the control electrode thereof.

In an exemplary embodiment, the metal traces and the driving circuit layer are disposed on the same layer.

In an exemplary embodiment, the cathode ring 300 may include a power supply electrode layer disposed on the silicon base substrate 10, a reflective layer disposed on a side of the power supply electrode layer away from the silicon base substrate, an anode layer disposed on a side of the reflective layer away from the power supply electrode layer, and a cathode layer disposed on a side of the anode layer away from the reflective layer.

In an exemplary embodiment, the bonding area 500 may include a bonding electrode layer disposed on the silicon base substrate 10 and an insulating layer for covering the bonding electrode layer, and a via exposing the bonding electrode in the bonding electrode layer is provided in the insulating layer.

In an exemplary embodiment, the bonding area 500 may further include a second align mark layer disposed on the silicon base substrate 10, and the second align mark layer and the bonding electrode layer are disposed on the same layer.

As shown in FIG. 1, the display substrate also includes a second align mark 51. The first align mark 52 is located on the metal trace area and made by hollowing out the color film layer, and the second align mark 51 is located in the bonding area on a side of the metal trace area and made by the metal layer.

In an exemplary embodiment, the first align mark 52 may be a bonding mark or any other type of align mark. For example, the first align mark 52 can also be used as the first align mark for the alignment of the cover plate.

In an exemplary embodiment, the shape of the orthographic projection of the first align mark 52 on the silicon base substrate may be a cross, a rectangle, a trapezoid or any other regular or irregular shape. FIG. 2 shows two shapes of the first align mark, one of which is a cross shape and the other is an irregular shape.

In an exemplary embodiment, as shown in FIG. 3, the display substrate may further include a dummy pixel area 200, which includes a silicon base substrate 10, a light-emitting structural layer 20 disposed on the silicon base substrate 10, an encapsulation layer 40 disposed on the light-emitting structural layer 20, and a color film layer 50 disposed on the encapsulation layer 40. One difference from the display area 100 is that the pixel driving circuit, gate driving circuit, and data driving circuit are not included in the silicon base substrate 10 of the dummy pixel area 200.

In an exemplary embodiment, as shown in FIG. 3, the metal trace area 400 includes a silicon base substrate 10, a first insulating layer disposed on the silicon base substrate 10, a second insulating layer disposed on the first insulating layer, an encapsulation layer 40 disposed on the second insulating layer and a color film layer 50 disposed on the encapsulation layer 40.

In an exemplary embodiment, the display substrate may further include a cover plate 70, which is disposed above the color film layer 50, so as to realize the function of protecting the color film layer 50. In an exemplary implementation, the cover plate 70 is connected with the silicon base substrate 10 through a sealant. The sealant is disposed between the silicon base substrate 10 and the cover plate 70, which can provide further protection against water and oxygen intrusion and greatly prolong the service life of the silicon OLED display substrate. In another exemplary implementation, sealant may be disposed on the sides of the cover plate 70, and the peripheral sides of the cover plate 70 and the silicon base substrate 10 are sealed by sealant. The end face of the sealant away from the silicon base substrate 10 is located between the surface of the cover plate 70 adjacent to the silicon base substrate 10 and the surface of the cover plate 70 away from the silicon base substrate 10, thereby not only ensuring the sealing effect, but also preventing the thickness of the display substrate from increasing when the sealant is higher than the cover plate 70. In an exemplary implementation, the cover plate 70 is disposed in the display area 100, which can better realize alignment and sealing, and avoid cracking of the cover plate 70 in the cutting process.

In an exemplary embodiment, the display substrate may further include a protective layer 60, which is disposed between the color film layer 50 and the cover plate 70 and covers the color film layer 50. In an exemplary implementation, the protective layer 60 may be made of silicon carbide (SiC) or silicon nitride carbide (SiCNx). Since SiC or SiCNx tends to exhibit inorganic characteristics, on the one hand, it can protect the color film layer 50, reduce the aging damage of the color film layer 50, and prolong the service life; on the other hand, it can form a flat surface, which is convenient for leveling the glue material in the subsequent process of attaching the cover plate and improves the attaching quality of the cover plate.

Figure 5:
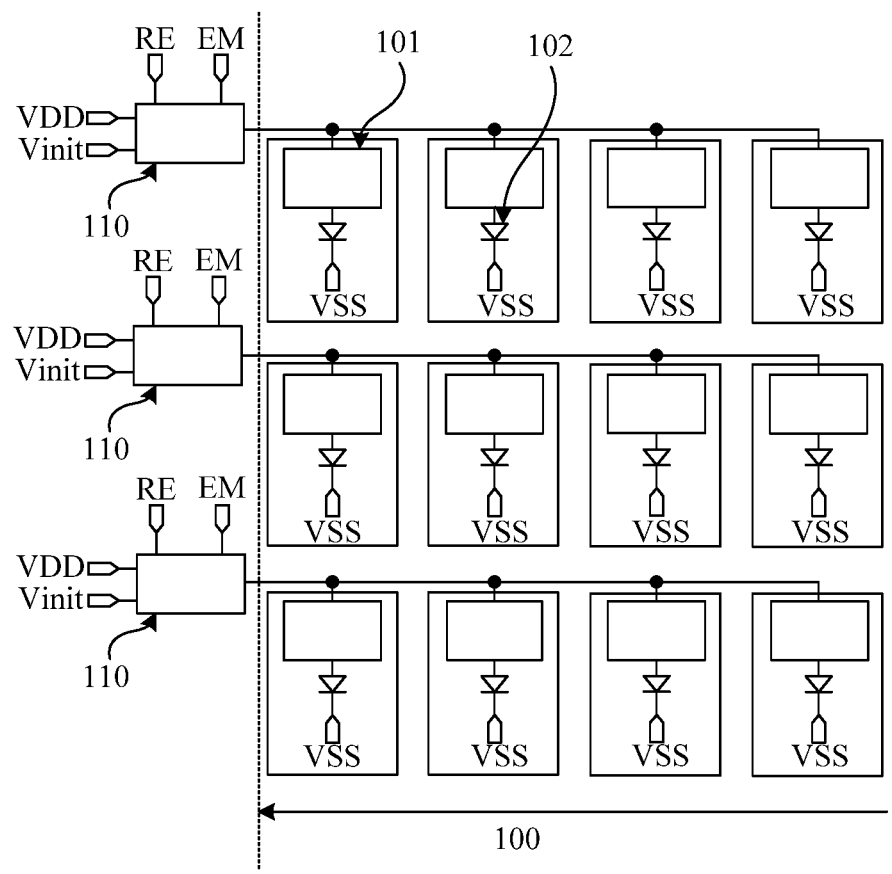
FIG. 5 is a schematic diagram of a circuit principle of a silicon base substrate according to an embodiment of the present disclosure.

FIG. 5 is a schematic diagram of a circuit principle of the silicon base substrate of the present disclosure. The silicon base substrate 10 includes a plurality of display units located in a display area 100 (effective display (AA) area) and a control circuit located in a peripheral area thereof. The plurality of display units in the display area 100 are regularly arranged to form a plurality of display rows and a plurality of display columns. Each display unit includes a pixel driving circuit 101 and a light-emitting device 102 connected with the pixel driving circuit 101. The pixel driving circuit 101 at least includes a driving transistor. The control circuit at least includes a plurality of voltage control circuits 110, each of which is connected with multiple pixel driving circuits 101. For example, one voltage control circuit 110 is connected with pixel driving circuits 101 in one display row. The first electrodes of driving transistors in the pixel driving circuits 101 in the display row are commonly connected with the voltage control circuit 110, the second electrode of each driving transistor is connected with the anode of the light-emitting device 102 in the display unit, and the cathode of the light-emitting device 102 is connected with an input end of a second power supply signal VSS. The voltage control circuit 110 is connected with an input end of a first power supply signal VDD, an input end of an initialization signal Vinit, an input end of a reset control signal RE and an input end of a light emission control signal EM respectively. The voltage control circuit 110 is configured to, in response to the reset control signal RE, output the initialization signal Vinit to the first electrode of the driving transistor to control the corresponding light-emitting device 102 to reset. The voltage control circuit 110 is further configured to, in response to the light emission control signal EM, output the first power supply signal VDD to the first electrode of the driving transistor to drive the light-emitting device 102 to emit light. By commonly connecting the pixel driving circuits 101 in one display row with the voltage control circuit 110, the structure of the pixel driving circuits 101 in the display area 100 can be simplified, and the occupied area of the pixel driving circuits 101 in the display area 100 can be reduced, so that more pixel driving circuits 101 and light-emitting devices 102 can be arranged in the display area 100, thus realizing high PPI display. The voltage control circuit 110 outputs the initialization signal Vinit to the first electrode of the driving transistor under the control of the reset control signal RE so as to control the corresponding light-emitting device 102 to reset, which can avoid the influence of the voltage applied to the light-emitting device 102 during the previous light emission on the next light emission, and can improve the afterimage phenomenon.

In an exemplary implementation, three display units of different colors make up one pixel, and the three display units can be red display unit, green display unit and blue display unit, respectively. In some possible implementations, one pixel can include four, five or more display units, which can be designed and determined according to actual application environments, and is not limited here. In some possible implementations, one voltage control circuit 110 may be connected with the pixel driving circuits 101 in two adjacent display units in the same display row, or may be connected with the pixel driving circuits 101 in three or more display units in the same display row, which is not limited here.

Figure 6:
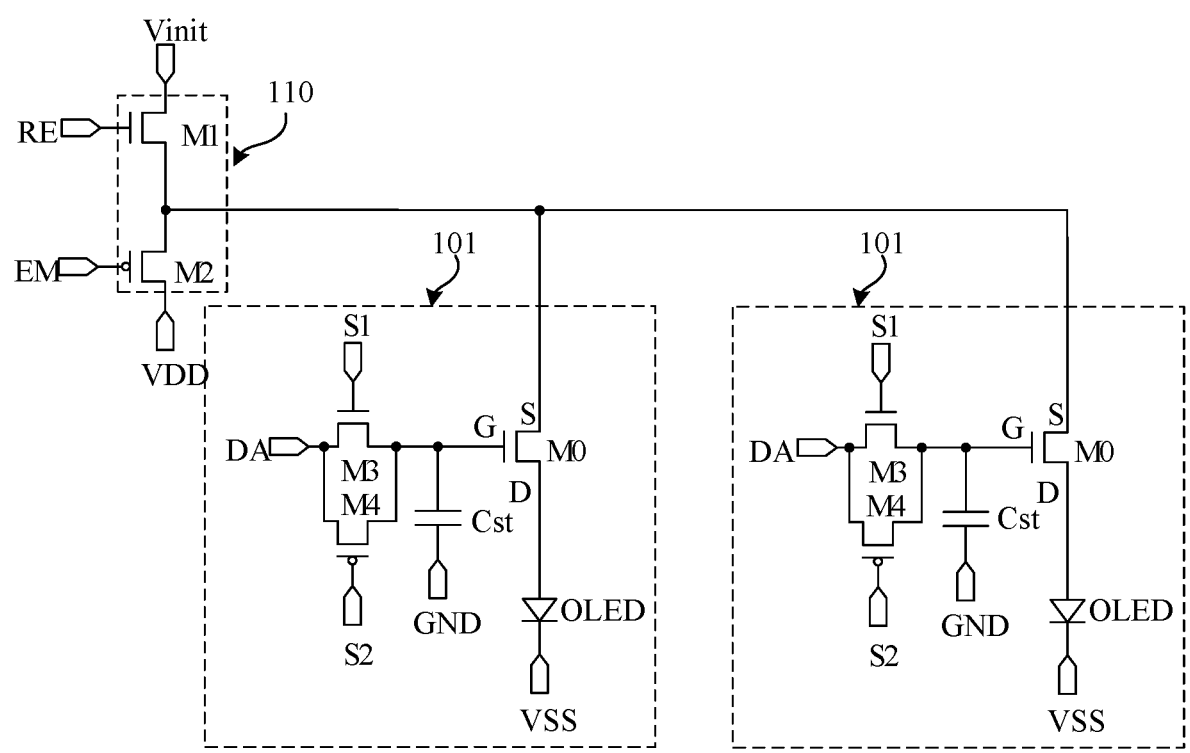
FIG. 6 is a schematic diagram of a circuit implementation of a voltage control circuit and a pixel driving circuit according to an embodiment of the present disclosure.

FIG. 6 is a schematic diagram of a circuit implementation of a voltage control circuit and a pixel driving circuit of the present disclosure. As shown in FIG. 6, the light-emitting device may include an OLED, the anode of OLED is connected with the second electrode D of the driving transistor M0, and the cathode of OLED is connected with the input end of the second power supply signal VSS. The voltage of the second power supply signal VSS is generally negative voltage or grounding voltage $V_{GND}$ (generally 0V), and the voltage of the initialization signal Vinit may also be set to grounding voltage $V_{GND}$. In an exemplary implementation, the OLED may be a Micro-OLED or a Mini-OLED, which is beneficial to realize high PPI display.

In an exemplary implementation, the voltage control circuit 110 is connected with two pixel driving circuits 101 in one display row. A pixel driving circuit 101 includes a driving transistor M0, a third transistor M3, a fourth transistor M4 and a storage capacitor Cst. The voltage control circuit 110 includes a first transistor M1 and a second transistor M2. The driving transistor M0, the first transistor M1, the second transistor M2, the third transistor M3 and the fourth transistor M4 are all metal oxide semiconductor (MOS) field-effect transistors fabricated in the silicon base substrate.

The first transistor M1 has its control electrode connected with the input end of the reset control signal RE for receiving the reset control signal RE, has its first electrode connected with the input end of the initialization signal Vinit for receiving the initialization signal Vinit, and has its second electrode connected with the first electrode S of the corresponding driving transistor M0 and the second electrode of the second transistor M2 respectively. The second transistor M2 has its control electrode connected with the input end of the light emission control signal EM for receiving the light emission control signal EM, has its first electrode connected with the input end of the first power supply signal VDD for receiving the first power supply signal VDD, and has its second electrode connected with the first electrode S of the corresponding driving transistor M0 and the second electrode of the first transistor M1 respectively. In an exemplary implementation, the types of the first transistor M1 and the second transistor M2 may be different. For example, the first transistor M1 is an N-type transistor and the second transistor M2 is a P-type transistor, or the first transistor M1 is a P-type transistor and the second transistor M2 is an N-type transistor. In some possible implementations, the types of the first transistor M1 and the second transistor M2 can be the same, and can be designed and determined according to actual application environments, which is not limited here.

The pixel driving circuit 101 includes a driving transistor M0, a third transistor M3, a fourth transistor M4 and a storage capacitor Cst. The first electrode S of the driving transistor M0 is connected with the second electrode of the first transistor M1 and the second electrode of the second transistor M2, and the second electrode D of the driving transistor M0 is connected with the anode of the OLED. The third transistor M3 has its control electrode connected with the input end of the first control electrode scanning signal S1 for receiving the first control electrode scanning signal 51, has its first electrode connected with the input end of the data signal DA for receiving the data signal DA, and has its second electrode connected with the control electrode G of the driving transistor M0. The fourth transistor M4 has its control electrode connected with the input end of the second control electrode scanning signal S2 for receiving the second control electrode scanning signal S2, has its first electrode connected with the input end of the data signal DA for receiving the data signal DA, and has its second electrode connected with the control electrode G of the driving transistor M0. The first end of the storage capacitor Cst is connected with the control electrode G of the driving transistor M0, and the second end of the storage capacitor Cst is connected with the ground terminal GND. In an exemplary implementation, the driving transistor M0 may be an N-type transistor. The types of the third transistor M3 and the fourth transistor M4 may be different. For example, the third transistor M3 is an N-type transistor and the fourth transistor M4 is a P-type transistor. When the voltage of the data signal DA is a voltage corresponding to a high gray tone, by turning on the P-type fourth transistor M4 to transmit the data signal DA to the control electrode G of the driving transistor M0, the voltage of the data signal DA can be prevented from being affected for example by the threshold voltage of the N-type third transistor M3. When the voltage of the data signal DA is a voltage corresponding to a low gray tone, by turning on the N-type third transistor M3 to transmit the data signal DA to the control electrode G of the driving transistor M0, the voltage of the data signal DA can be prevented from being affected by the threshold voltage of the P-type fourth transistor M4. In this way, the voltage range input into the control electrode G of the driving transistor M0 can be increased. In some possible implementations, the types of the third transistor M3 and the fourth transistor M4 may be that the third transistor M3 is a P-type transistor and the fourth transistor M4 is an N-type transistor. In some possible implementations, the pixel driving circuit may be a 3T1C, 5T1C or 7T1C circuit structure, or may be a circuit structure with internal compensation or external compensation function, which is not limited by the present disclosure.

The structure of the display substrate is described below through an example of a preparation process of the display substrate. The "patterning process" mentioned in the present disclosure includes processes, such as film layer deposition, photoresist coating, mask exposure, development, etching, and photoresist stripping. Deposition may be implemented by any one or more of sputtering, evaporation and chemical vapor deposition. Coating may be implemented by any one or more of spraying and spin coating. Etching may be implemented by any one or more of dry etching and wet etching. "Thin film" refers to a layer of thin film fabricated by a certain material on a base substrate using deposition or coating process. If the "thin film" does not need a patterning process during the whole manufacturing process, the "thin film" can also be called a "layer". If the "thin film" needs a patterning process during the whole manufacturing process, it is called "thin film" before the patterning process and "layer" after the patterning process. The "layer" after the patterning process contains at least one "pattern". In the present disclosure, "A and B are disposed on the same layer" means that A and B are formed simultaneously by the same patterning process. In the present disclosure, "the orthographic projection of A includes the orthographic projection of B" means that the orthographic projection of B falls within the range of the orthographic projection of A, or the orthographic projection of A covers the orthographic projection of B.

Figure 7:
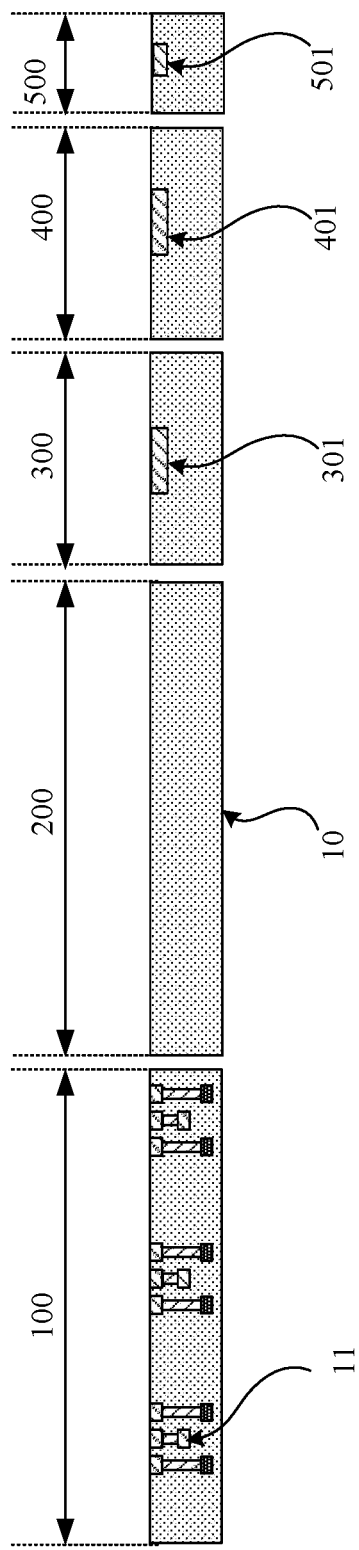
FIG. 7 is a schematic diagram of a display substrate after preparing a silicon base substrate according to an embodiment of the present disclosure.

(1) A silicon base substrate 10 is prepared. The silicon base substrate 10 includes a display area 100 and a peripheral area surrounding the display area. The peripheral area includes a dummy pixel area 200, a cathode ring 300, a metal trace area 400 and a bonding area 500. The display area 100 includes a plurality of display units, and the silicon base substrate 10 in each display unit is integrated with a pixel driving circuit. The bonding area 500 is disposed on a side of the display area 100; the silicon base substrate 10 in the cathode ring 300 is integrated with a power supply circuit; the silicon base substrate 10 in the metal trace area 400 is integrated with metal traces; and the silicon base substrate 10 in the bonding area 500 is integrated with a bonding circuit, as shown in FIG. 7. As an exemplary illustration, FIG. 7 illustrates three display units in the display area 100, i.e., the first display unit, the second display unit and the third display unit; illustrates the driving transistors 11 included in the pixel driving circuits; illustrates the power supply electrode 301 in the cathode ring 300; illustrates the metal traces 401 in the metal trace area 400; and illustrates the bonding electrode 501 included in the bonding circuit. In an exemplary implementation, a driving thin film transistor in the display area 100 includes an active layer, a gate electrode, a source electrode, a drain electrode and a gate connection electrode. The source electrode and the drain electrode are respectively connected with the active layer through conductive pillars, the gate connection electrode is connected with the gate electrode through a conductive pillar, and the bonding electrode 501 in the bonding area 500 is disposed on the same layer with the source electrode, the drain electrode and the gate connection electrode. Mature CMOS integrated circuit technology can be used to prepare the silicon base substrate 10, which is not limited by the present disclosure. After preparation, the surface of the silicon base substrate 10 exposes the source electrode, drain electrode and gate connection electrode in the display area 100, the power supply electrode 301 in the cathode ring 300, the metal trace 401 in the metal trace area 400 and the bonding electrode 501 in the bonding area 500.

Figure 8:
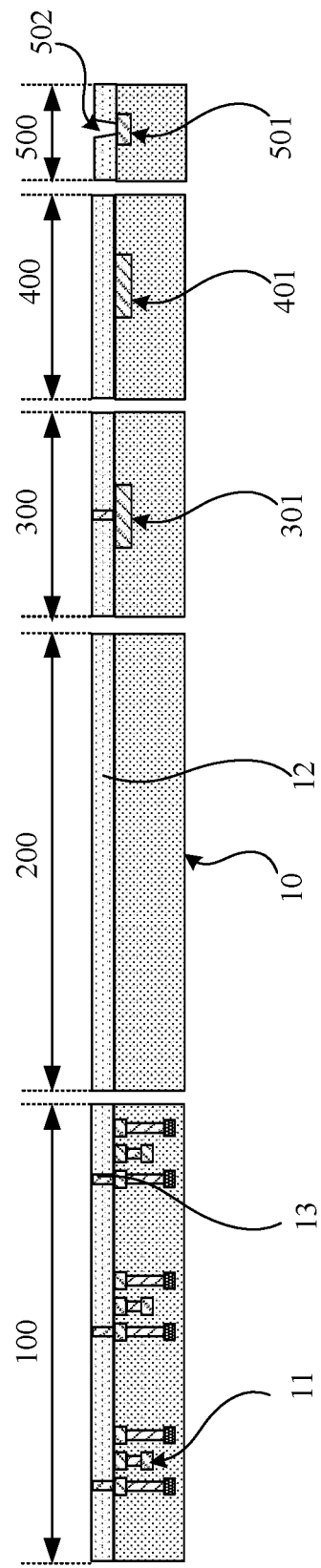
FIG. 8 is a schematic diagram of a display substrate after forming a first insulating layer and a first conductive pillar according to an embodiment of the present disclosure.

(2) A first insulating thin film is deposited on the silicon base substrate 10, and the first insulating thin film is patterned by a patterning process to form a pattern of the first insulating layer 12 covering the silicon base substrate 10. A plurality of first vias are formed in the first insulating layer 12 in the display area 100, at least one second via is formed in the first insulating layer 12 in the cathode ring 300, and at least one third via is formed in the first insulating layer 12 in the bonding area 500. The plurality of first vias expose the drain electrode in each display unit respectively, the second via exposes the power supply electrode 301, and the third via exposes the bonding electrode 501. Then, a plurality of first conductive pillars 13 are formed in the first vias and the second via in the first insulating layer 12. The first conductive pillars 13 in the first vias are connected with the drain electrodes in the corresponding display units, and the first conductive pillar 13 in the second via is connected with the power supply electrode 301 in the cathode ring 300, as shown in FIG. 8. In an exemplary implementation, the first conductive pillars 13 may be made of metal material. After the first conductive pillars 13 are formed by filling treatment, polishing treatment may also be carried out. The surfaces of the first insulating layer 12 and the first conductive pillars 13 are corroded and rubbed by polishing process, and parts of the first insulating layer 12 and the first conductive pillars 13 in thickness are removed, so that the first insulating layer 12 and the first conductive pillars 13 form a flush surface. In some possible implementations, the first conductive pillars 13 may be made of metal tungsten (W), and the via filled with tungsten metal is called tungsten via (W-via). When the first insulating layer 12 is thicker, the stability of the conductive path can be ensured by tungsten vias. Due to the mature process of manufacturing tungsten vias, the resulting first insulating layer 12 has good surface flatness, which is beneficial to reducing the contact resistance. Tungsten vias are not only suitable for the connection between the silicon base substrate 10 and the reflective layer, but also suitable for the connection between the reflective layer and the anode layer, and connections between other wiring layers.

Figure 9:
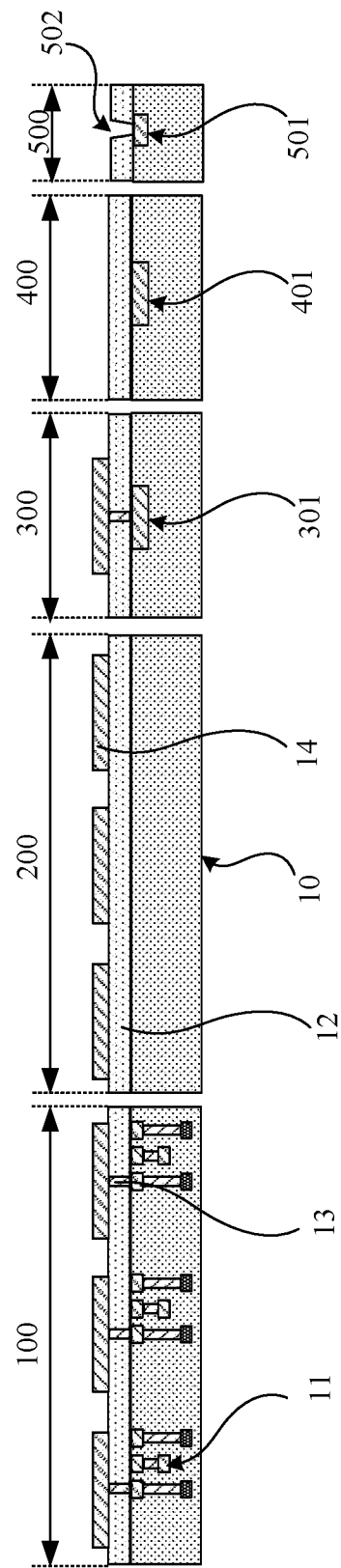
FIG. 9 is a schematic diagram of a display substrate after forming a reflective electrode according to an embodiment of the present disclosure.

(3) A first metal thin film is deposited on the silicon base substrate 10 with the formed above structure. The first metal thin film is patterned by a patterning process to form a reflective layer pattern on the first insulating layer 12. The reflective layer includes a plurality of reflective electrodes 14 disposed in the display area 100, the dummy pixel area 200 and the cathode ring 300. In each display unit, the reflective electrode 14 is connected with the drain electrode through the first conductive pillar 13; and in the cathode ring 300, the reflective electrode 14 is connected with the power supply electrode 301 through the first conductive pillar 13, as shown in FIG. 9. In an exemplary implementation, the reflective electrode 14 of each display unit is used to form a microcavity structure with a cathode subsequently formed. With the strong reflection effect of the reflective electrodes, the light directly emitted by the organic light-emitting layer and the light reflected by the reflective electrodes interfere with each other, thereby improving the color gamut of the emitted light and enhancing the brightness of the emitted light. In this patterning process, the film layer structures in the metal trace area 400 and the bonding area 500 are not changed, which include the first insulating layer 12 disposed on the silicon base substrate 10, and the bonding via 502 exposing the bonding electrode 501 is provided in the first insulating layer 12.

Figure 10:
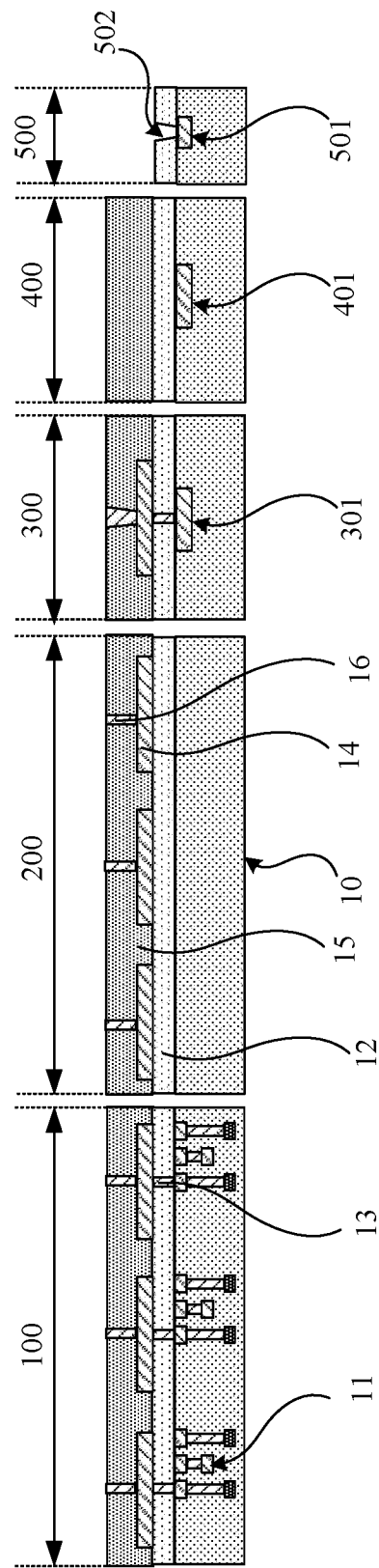
FIG. 10 is a schematic diagram of a display substrate after forming a second insulating layer and a second conductive pillar according to an embodiment of the present disclosure.

(4) A second insulating thin film is deposited on the silicon base substrate 10 with the formed above structure, and the second insulating thin film is patterned by a patterning process to form a pattern of the second insulating layer 15 covering the silicon base substrate 10. A plurality of fourth vias are formed in the second insulating layer 15 in the display area 100, a plurality of fifth vias are formed in the second insulating layer 15 in the dummy pixel area 200, and at least one sixth via is formed in the second insulating layer 15 in the cathode ring 300. The plurality of fourth vias expose the reflective electrode 14 in each display unit respectively, the plurality of fifth vias expose the reflective electrodes 14 in each dummy pixel area 200 respectively, and the sixth via exposes the reflective electrode 14 in the cathode ring 300. Then, a plurality of second conductive pillars 16 are formed in the fourth vias, the fifth vias and the sixth via in the second insulating layer 15. The second conductive pillars 16 in the fourth vias are connected with the reflective electrodes 14 in the corresponding display units, the second conductive pillars 16 in the fifth vias are connected with the reflective electrodes 14 in the dummy pixel area 200, and the second conductive pillar 16 in the sixth via is connected with the reflective electrode 14 in the cathode ring 300, as shown in FIG. 10. In an exemplary implementation, the second conductive pillars 16 may be made of metal material. After the second conductive pillars 16 are formed by filling treatment, polishing treatment may also be carried out. The surfaces of the second insulating layer 15 and the second conductive pillars 16 are corroded and rubbed by polishing process, and parts of the second insulating layer 15 and the second conductive pillars 16 in thickness are removed, so that the second insulating layer 15 and the second conductive pillars 16 form a flush surface. In some possible implementations, the second conductive pillars 16 may be made of metal tungsten (W). In this patterning process, the film layer structure of the bonding area 500 is not changed.

Figure 11:
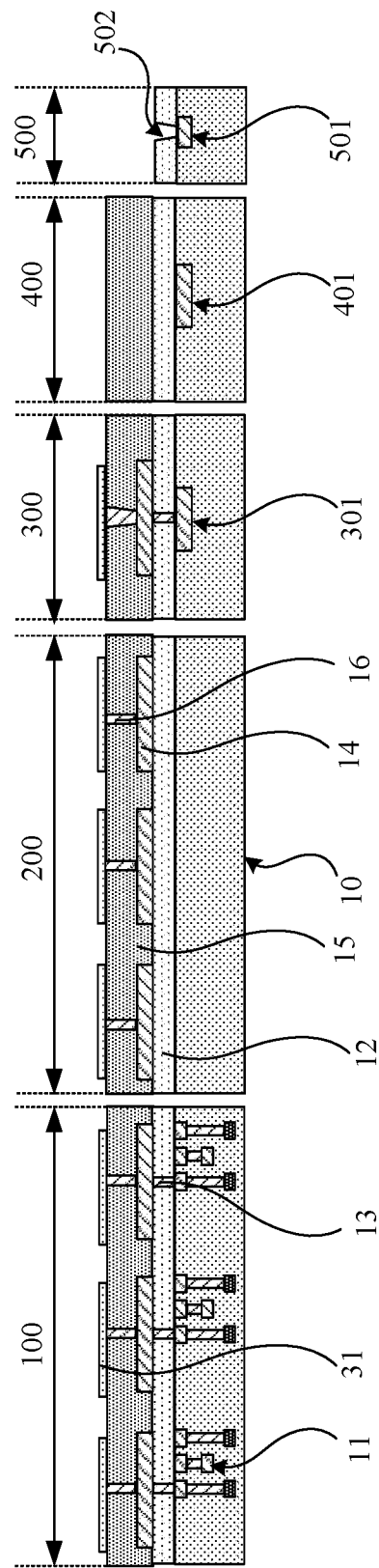
FIG. 11 is a schematic diagram of a display substrate after forming an anode layer according to an embodiment of the present disclosure.

(5) A transparent conductive thin film is deposited on the silicon base substrate 10 with the formed above structure. The transparent conductive thin film is patterned by a patterning process to form an anode layer pattern on the second insulating layer 15 in the display area 100, the dummy pixel area 200 and the cathode ring 300. The anode layer includes a plurality of anodes 31 disposed in the display area 100, the dummy pixel area 200 and the cathode ring 300, and the anodes 31 are connected with the reflective electrodes 14 through the second conductive pillars 16, as shown in FIG. 11. The anodes 31 are connected with the reflective electrodes 14 through the second conductive pillars 16, and the reflective electrodes 14 are connected with the drain electrodes of the driving thin film transistors 11 through the first conductive pillars 13, so that the electrical signals provided by the pixel driving circuits are transmitted to the anodes 31 through the reflective electrodes 14. On the one hand, the reflective electrode 14 forms a conductive channel between the pixel driving circuit and the anode; on the other hand, it forms a microcavity structure, which is not only beneficial for the pixel driving circuit to control light-emitting devices, but also makes the structure of the display substrate more compact, thereby facilitating the miniaturization of the silicon OLED display apparatus. In this patterning process, the film layer structures of the metal trace area 400 and the bonding area 500 are not changed.

Figure 12:
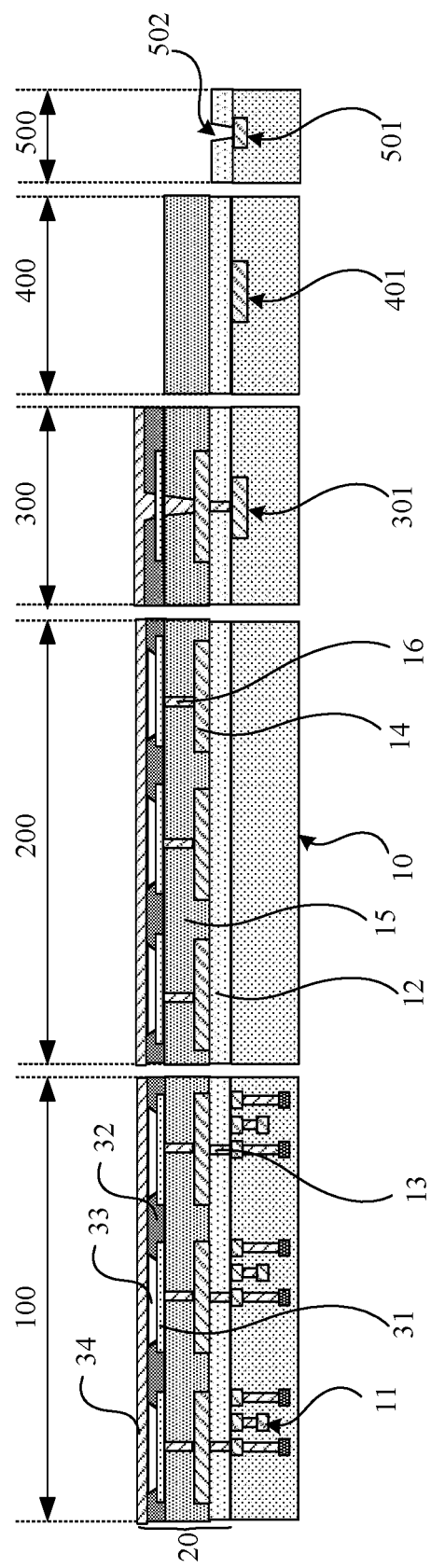
FIG. 12 is a schematic diagram of a display substrate after forming an organic light-emitting layer and a cathode layer according to an embodiment of the present disclosure.

(6) A pixel defining film is coated on the silicon base substrate 10 with the formed above structure, and a pattern of the pixel defining layer (PDL) 32 is formed in the display area 100, the dummy pixel area 200 and the cathode ring 300 by masking, exposure and development processes. In each display unit, the pixel defining layer 32 is provided with a pixel opening, which exposes the surface of the anode 31. Then, organic light-emitting layers 33 and cathodes 34 are sequentially formed in the display area 100 and the dummy pixel area 200. In each display unit, the organic light-emitting layer 33 is connected with the anode 31 of the corresponding display unit, and the planar cathode 34 is connected with the organic light-emitting layer 33 in each display unit. A cathode 34 is formed in the cathode ring 300, and the cathode 34 in the cathode ring 300 is connected with the anode 31 through the pixel opening, as shown in FIG. 12. In an exemplary implementation, the cathode 34 is a transflective electrode, and constitutes a microcavity structure with the reflective electrode 14 formed as described above. In this patterning process, the film layer structures of the metal trace area 400 and the bonding area 500 are not changed.

In the aforementioned preparation process, the first insulating thin film and the second insulating thin film may be made of silicon oxide (SiOx), silicon nitride (SiNx) or silicon oxynitride (SiON); and may have a single-layer structure or a multi-layer composite structure. The first metal thin film may be made of a metal material, such as silver (Ag), copper (Cu), aluminum (Al), or molybdenum (Mo); or an alloy material consisting of metals, such as aluminum neodymium alloy (AlNd) or molybdenum niobium alloy (MoNb). The alloy material may have a single-layer structure, or a multi-layer composite structure, such as Mo/Cu/Mo composite structure. The transparent conductive thin film may be made of indium tin oxide (ITO) or indium zinc oxide (IZO), or a composite structure of ITO/Ag/ITO. The pixel defining layer may be made of polyimide, acrylic or polyethylene terephthalate, etc.

Figure 13:
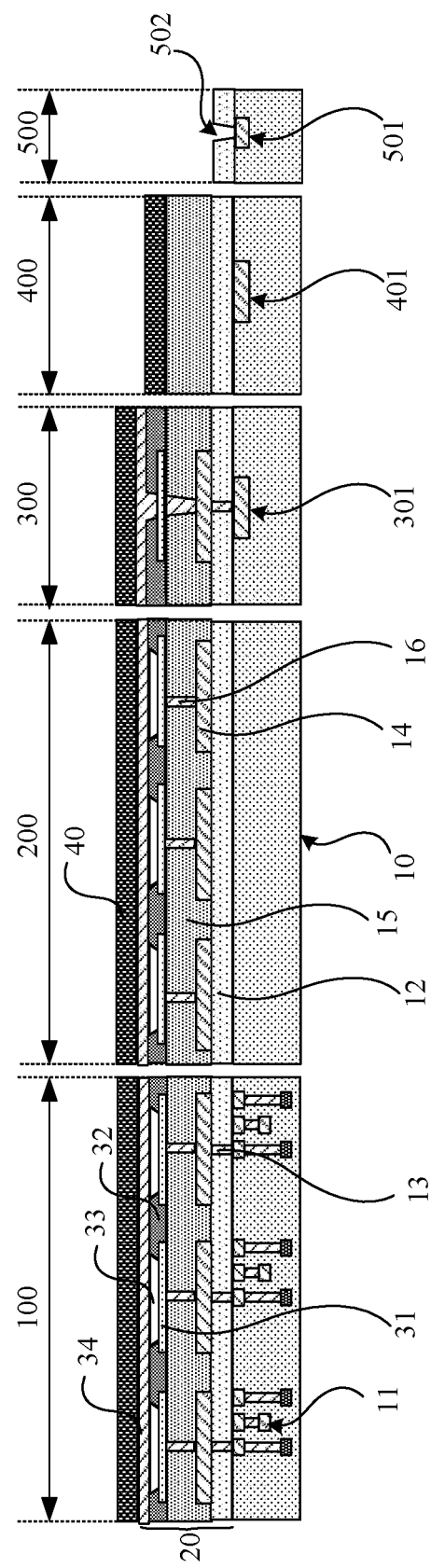
FIG. 13 is a schematic diagram of a display substrate after forming an encapsulation layer according to an embodiment of the present disclosure.

(7) On the silicon base substrate 10 with the formed above structure, an encapsulation layer pattern is formed in the display area 100, the dummy pixel area 200, the cathode ring 300 and the metal trace area 400. The encapsulation layer 40 is a thin film encapsulation structure, as shown in FIG. 13.

Figure 14:
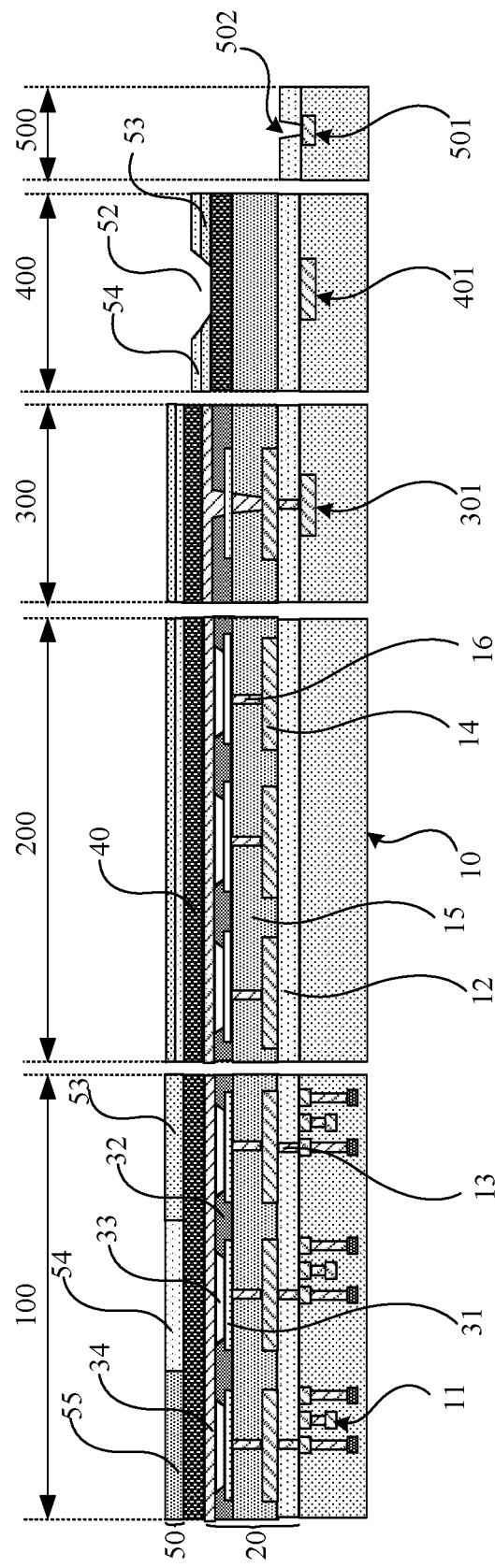
FIG. 14 is a schematic diagram of a display substrate after forming a color film layer according to an embodiment of the present disclosure.

(8) On the silicon base substrate 10 with the formed above structure, a pattern of a color film layer 50 is formed in the display area 100, the dummy pixel area 200, the cathode ring 300 and part of the metal trace area 400. The color film layer 50 in the display area 100 includes a first color unit 53, a second color unit 54 and a third color unit 55 arranged at intervals with each other or overlapping with each other. In an exemplary embodiment, the color units in the display area 100 may overlap with each other as a black matrix, or a black matrix may be disposed between the color units. The color film layer 50 in the dummy pixel area 200, the cathode ring 300 and part of the metal trace area 400 includes a first color unit 53 and a second color unit 54 which are stacked, and the color film layer 50 is provided with an opening in the shape of the first align mark 52 at a position corresponding to the metal traces of the metal trace area 400, as shown in FIG. 14. In an exemplary implementation, the first color unit may be a green color unit G, the second color unit may be a red color unit R, and the third color unit may be a blue color unit B. In some possible implementations, the preparation process of the color film layer 50 includes: first forming a blue color unit B, then forming a red color unit R, and then forming a green color unit G. The adhesion of the blue color film is relatively high, and forming the blue color unit B first can reduce the possibility of peeling off the color film layer 50 from the cathode. Because the red color unit R has low adhesion and good fluidity, the number of bubbles on the surfaces of the blue color unit B and the red color unit R away from the cathode can be reduced in the process of forming the red color unit R, so that the uniformity of film thickness of the blue color unit B and the red color unit R at the overlapping position can be improved. Since the base materials of the green color unit G and the red color unit R are approximately the same, the adhesion between the green color unit G and the red color unit R is high, which can reduce the possibility of peeling off the color film layer 50 from the cathode. In some possible implementations, the color film layer 50 may include other color units, such as white or yellow.

According to the display substrate manufactured by the method of the present disclosure, no bonding mark is required to be manufactured on the below reflective metal layer or anode metal layer, but an opening corresponding to the bonding mark is manufactured through the color film layer above the metal trace area, and a black-and-white first align mark is formed under the charge coupled device (CCD) image sensor of the bonding platform by reflecting light through the metal traces below the opening. Considering the fluidity of color glue material, the manufacturing error after color glue exposure is about 0.2 microns, and the accuracy requirement of the bonding platform is about 1 micron. Therefore, the first align mark made by color film layer fully meets the accuracy requirement of the bonding platform.

In subsequent processes, a cover plate 70 is formed by a sealing process, and the cover plate 70 and the silicon base substrate 10 are fixed by a sealant. After the above process is completed, the film layer structure in the bonding area 500 is not changed. Since the silicon base substrate 10, the cover plate 70 and the sealant together form a closed space, the protection against water and oxygen is provided, and the service life of the silicon OLED display substrate is greatly prolonged. Subsequently, the formed display motherboard is cut to form a separate display substrate.

It can be seen from the structure and preparation process of the display substrate of the present disclosure that the hollowed-out first align mark is disposed at a position where the color film layer opposes to the metal trace area, so that reflection of light may occur at the metal trace area at the hollowed-out first align mark, and may be avoided at other positions due to the covering of color film layer. That is, obvious gray level change is generated at the border of the first align mark, so that the border position of the first align mark can be accurately identified. The first align mark is manufactured by this method, which reduces the risk of capacitance breakdown, reduces the border area of the substrate and improves the cutting efficiency of the substrate, and the preparation process is simple and reliable.

The preparation process of the present disclosure can be realized by using mature preparation equipments, has small modification on the process, high compatibility, simple process flow, easy periodic maintenance of equipments, high production efficiency, low production cost, high yield and is convenience for mass production. The prepared display substrate can be applied to virtual reality equipment or enhanced display equipment or other types of display apparatus, and has a good application prospect.

The structure and its preparation process shown in the present disclosure are only an exemplary description. In an exemplary implementation, the corresponding structures can be changed and the patterning processes can be increased or decreased according to actual needs. For example, the length of the microcavity structure in each display unit may be the same or may be different. In another example, in the process of forming the reflective electrode in the display area, the corresponding pad may be formed in the bonding area, which is not specifically limited in the present disclosure.

Figure 15:
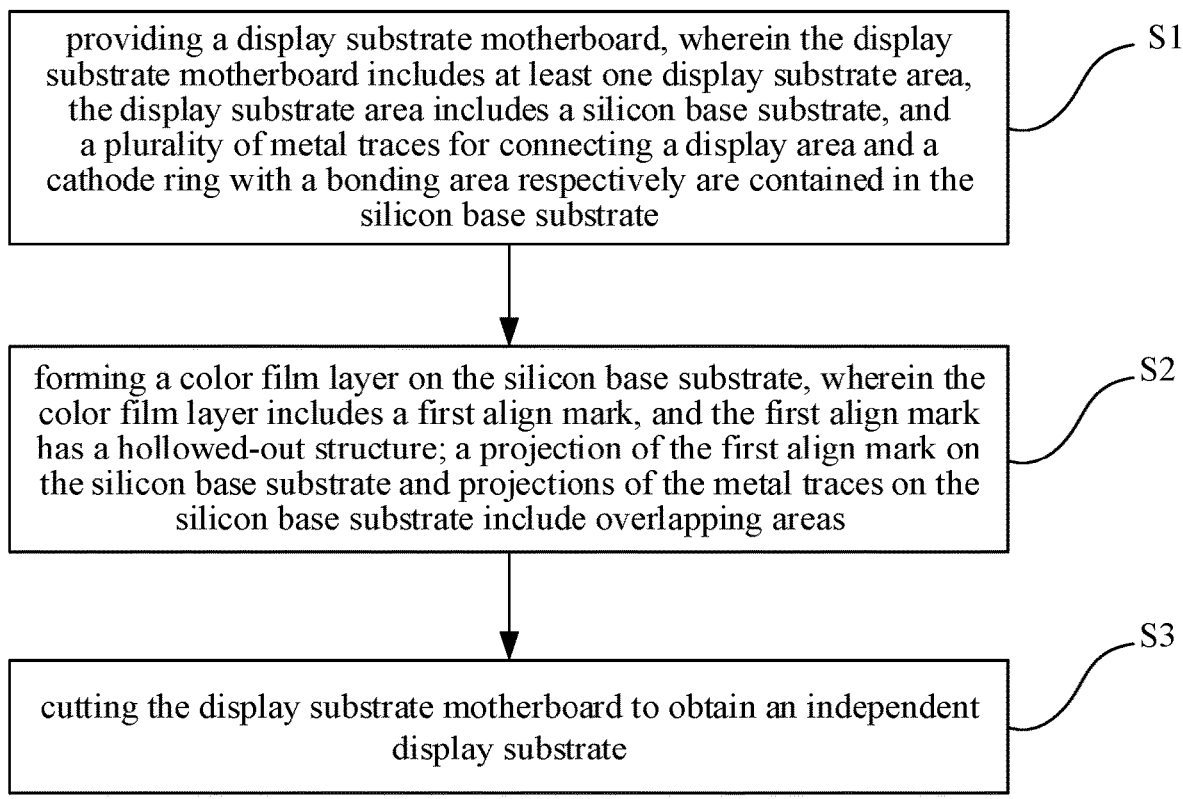
FIG. 15 is a schematic flowchart of a manufacturing method of a display substrate according to an embodiment of the present disclosure.

The present disclosure also provides a manufacturing method of the display substrate, as shown in FIG. 15, which includes steps S1 to S3.

Step S1 includes: providing a display substrate motherboard, wherein the display substrate motherboard includes at least one display substrate area, the display substrate area includes a silicon base substrate, and a plurality of metal traces for connecting a display area and a cathode ring with a bonding area respectively are contained in the silicon base substrate.

Step S2 includes: forming a color film layer on the silicon base substrate, wherein the color film layer includes a first align mark, and the first align mark has a hollowed-out structure; a projection of the first align mark on the silicon base substrate and projections of the metal traces on the silicon base substrate include overlapping areas.

In an exemplary embodiment, the color film layer in the display area includes a first color unit, a second color unit and a third color unit arranged in an array, wherein the first color unit, the second color unit and the third color unit can be one of a red (R) color filter (CF) unit, a green (G) color filter unit and a blue (B) color filter unit, respectively.

In an exemplary embodiment, the color film layer outside the display area includes a first color unit layer and a second color unit layer which are sequentially stacked, and the first color unit layer and the second color unit layer include mutually penetrating apertures to form the first align mark through the apertures. In some possible implementations, the first color unit may be a blue color filter unit and the second color unit may be a red color filter unit.

In an exemplary embodiment, the first align mark may be a bonding mark or any other type of align mark.

In an exemplary embodiment, the shape of the orthographic projection of the first align mark on the silicon base substrate may be a cross, a rectangle, or any other regular or irregular shape.

In an exemplary implementation, the length of the openings of the first align mark is 50 to 150 microns, the width of the openings of the first align mark is 20 to 50 microns; the width of the metal trace is 50 to 150 nanometers, and the spacing between adjacent metal traces is 30 to 50 nanometers.

For example, the first align mark has a cross-shaped structure consisting of a transverse opening and a vertical opening. The transverse opening and the vertical opening are both 100 microns in length and 30 microns in width. The width of a metal trace is 100 nanometers, and the spacing between adjacent metal traces is 50 nanometers. The plurality of metal traces are integrated together through an integrated circuit, and due to the dense arrangement of the plurality of metal traces, reflection of light can occur at the hollowed-out first align mark of the color film layer.

Step S3 includes: cutting the display substrate motherboard to obtain a separate display substrate.

The present disclosure further provides a display apparatus including the aforementioned display substrate. The display apparatus may be a virtual reality apparatus, an augmented reality apparatus or a near-eye display apparatus; or may be a mobile phone, a tablet computer, a television, a display, a notebook computer, a digital photo frame or a navigator; or any other product or component with a display function.

Although implementations disclosed in the present disclosure are as the above, the described contents are only implementations adopted for facilitating the understanding of the present disclosure, and are not used to limit the present disclosure. Any person skilled in the art to which the present disclosure pertains may make any modifications and variations in the forms and details of implementation without departing from the spirit and the scope of the present disclosure, but the patent protection scope of the present disclosure shall still be subject to the scope defined in the appended claims.

What we claim is:

1. A display substrate, comprising: a silicon base substrate and a color film layer disposed on the silicon base substrate, the silicon base substrate containing a plurality of metal traces for connecting a display area and a cathode ring with a bonding area respectively; the color film layer comprising a first align mark, and the first align mark having a hollowed-out structure,
    wherein a projection of the first align mark on the silicon base substrate and projections of the metal traces on the silicon base substrate comprise overlapping areas,
    wherein the display area comprise a light-emitting structural layer disposed on the silicon base substrate, and the light-emitting structural layer comprises a reflective layer, an anode layer, an organic light-emitting layer and a cathode layer which are sequentially stacked,
    wherein a driving circuit layer is disposed in the silicon base substrate in the display area and comprises a first scanning line, a first power line, a data line, a switching transistor and a driving transistor; a control electrode of the switching transistor is connected with the first scanning line, a first electrode of the switching transistor is connected with the data line, a second electrode of the switching transistor is connected with a control electrode of the driving transistor, and a first electrode of the driving transistor is connected with the first power line; the switching transistor is configured to receive a data signal transmitted by the data line under the control of a first scanning signal output by the first scanning line, to make the control electrode of the driving transistor receive the data signals, and the driving transistor is configured to generate a corresponding current at the second electrode under the control of the data signal received by the control electrode thereof, and
    wherein the metal traces and the driving circuit layer are disposed on the same layer.

2. The display substrate according to claim 1, wherein the color film layer in the display area comprises a first color unit, a second color unit and a third color unit arranged in an array; the color film layer outside the display area comprises at least one of the first color unit, the second color unit and the third color unit forming a complete surface.

3. The display substrate according to claim 2, wherein the color film layer outside the display area comprises a first color unit layer and a second color unit layer which are sequentially stacked, and the first color unit layer and the second color unit layer comprise mutually penetrating apertures to form the first align mark through the apertures.

4. The display substrate according to claim 3, wherein the first color unit layer is a blue color filter unit layer and the second color unit layer is a red color filter unit layer.

5. The display substrate according to claim 1, wherein the cathode ring comprises a power supply electrode layer disposed on the silicon base substrate, a reflective layer disposed on a side of the power supply electrode layer away from the silicon base substrate, an anode layer disposed on a side of the reflective layer away from the power supply electrode layer, and a cathode layer disposed on a side of the anode layer away from the reflective layer.

6. The display substrate according to claim 1, wherein the bonding area comprises a bonding electrode layer disposed on the silicon base substrate and an insulating layer for covering the bonding electrode layer, and a via exposing a bonding electrode in the bonding electrode layer is disposed in the insulating layer.

7. The display substrate according to claim 6, wherein the bonding area further comprises a second align mark layer disposed on the silicon base substrate, and the second align mark layer and the bonding electrode layer are disposed on the same layer.

8. A display apparatus comprising the display substrate of claim 1.

9. A method for manufacturing a display substrate, comprising:
    providing a display substrate motherboard, wherein the display substrate motherboard comprises at least one display substrate area, the display substrate area comprises a silicon base substrate, and a plurality of metal traces for connecting a display area and a cathode ring with a bonding area respectively are contained in the silicon base substrate;
    forming a color film layer on the silicon base substrate, wherein the color film layer comprises a first align mark, the first align mark has a hollowed-out structure, and a projection of the first align mark on the silicon base substrate and projections of the metal traces on the silicon base substrate comprise overlapping areas; and cutting the display substrate motherboard to obtain a separate display substrate, wherein the display area comprise a light-emitting structural layer disposed on the silicon base substrate, and the light-emitting structural layer comprises a reflective layer, an anode layer, an organic light-emitting layer and a cathode layer which are sequentially stacked, wherein a driving circuit layer is disposed in the silicon base substrate in the display area and comprises a first scanning line, a first power line, a data line, a switching transistor and a driving transistor; a control electrode of the switching transistor is connected with the first scanning line, a first electrode of the switching transistor is connected with the data line, a second electrode of the switching transistor is connected with a control electrode of the driving transistor, and a first electrode of the driving transistor is connected with the first power line; the switching transistor is configured to receive a data signal transmitted by the data line under the control of a first scanning signal output by the first scanning line, to make the control electrode of the driving transistor receive the data signals, and the driving transistor is configured to generate a corresponding current at the second electrode under the control of the data signal received by the control electrode thereof, and wherein the metal traces and the driving circuit layer are disposed on the same layer.

10. The manufacturing method according to claim 9, wherein the color film layer in the display area comprises a first color unit, a second color unit and a third color unit arranged in an array; the color film layer outside the display area comprises at least one of the first color unit, the second color unit and the third color unit forming a complete surface.

11. A display substrate, comprising: a silicon base substrate and a color film layer disposed on the silicon base substrate, the silicon base substrate containing a plurality of metal traces for connecting a display area and a cathode ring with a bonding area respectively; the color film layer comprising a first align mark, and the first align mark having a hollowed-out structure, wherein a projection of the first align mark on the silicon base substrate and projections of the metal traces on the silicon base substrate comprise overlapping areas, wherein a length of the first align mark is 50 to 150 microns, a width of the first align mark is 20 to 50 microns; a width of the metal trace is 50 to 150 nanometers, and a spacing between adjacent metal traces is 30 to 50 nanometers, and wherein a ratio of an area of the metal traces exposed by the first align mark to an area of the first align mark is greater than or equal to 80%.

* * * * *